(12) United States Patent
Kropfitsch et al.

(10) Patent No.: US 10,924,069 B2
(45) Date of Patent: Feb. 16, 2021

(54) SYSTEM AND METHOD FOR LOW DISTORTION CAPACITIVE SIGNAL SOURCE AMPLIFIER

(71) Applicant: Infineon Technologies AG, Neubiberg (DE)

(72) Inventors: Michael Kropfitsch, Koettmannsdorf (AT); Jose Luis Ceballos, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 127 days.

(21) Appl. No.: 16/171,741

(22) Filed: Oct. 26, 2018

(65) Prior Publication Data

US 2019/0068139 A1 Feb. 28, 2019

Related U.S. Application Data

(62) Division of application No. 14/935,072, filed on Nov. 6, 2015, now Pat. No. 10,171,046, which is a division
(Continued)

(51) Int. Cl.
 *H03F 3/183* (2006.01)
 *H03F 3/187* (2006.01)
(Continued)

(52) U.S. Cl.
 CPC .............. *H03F 3/183* (2013.01); *H03F 1/32* (2013.01); *H03F 1/56* (2013.01); *H03F 3/187* (2013.01);
(Continued)

(58) Field of Classification Search
 CPC .......... H04R 3/007; H04R 19/04; H04R 3/00; H04R 19/005; H03G 3/001;
(Continued)

(56) References Cited

U.S. PATENT DOCUMENTS

| 4,112,384 A * | 9/1978 | Buchberger ......... H03G 3/3005 330/135 |
| 4,265,159 A * | 5/1981 | Liebman ................. G09F 19/20 340/815.74 |

(Continued)

FOREIGN PATENT DOCUMENTS

| CN | 1047586 A | 12/1990 |
| CN | 1741685 A | 3/2006 |

(Continued)

OTHER PUBLICATIONS

Delbruek, T., et al., "Analog VLSI Adaptive, Logarithmic, Wide-Dynamic-Range Photoreceptor," 4 pages; 1994.
(Continued)

*Primary Examiner* — Davetta W Goins
*Assistant Examiner* — Kuassi A Ganmavo
(74) *Attorney, Agent, or Firm* — Slater Matsil, LLP (57) ABSTRACT

According to an embodiment, a method includes amplifying a signal provided by a capacitive signal source to form an amplified signal, detecting a peak voltage of the amplified signal, and adjusting a controllable impedance coupled to an output of the capacitive signal source in response to detecting the peak voltage. The controllable impedance is adjusted to a value inversely proportional to the detected peak voltage.

16 Claims, 10 Drawing Sheets

Related U.S. Application Data of application No. 13/217,890, filed on Aug. 25, 2011, now Pat. No. 9,236,837.

(51) Int. Cl.

| | |
|---|---|
| *H03F 1/56* | (2006.01) |
| *H03F 1/32* | (2006.01) |
| *H04R 3/00* | (2006.01) |
| *H04R 19/00* | (2006.01) |
| *H04R 19/04* | (2006.01) |

(52) U.S. Cl.
CPC ............ *H04R 3/00* (2013.01); *H04R 19/005* (2013.01); *H04R 19/04* (2013.01); *H03F 2200/03* (2013.01); *H03F 2200/105* (2013.01); *H03F 2200/165* (2013.01); *H03F 2200/211* (2013.01); *H03F 2200/213* (2013.01)

(58) Field of Classification Search
CPC ....... H01L 27/0629; H03F 3/183; H03F 1/32; H03F 1/56; H03F 3/187; H03F 2200/03; H03F 2200/05; H03F 2200/165; H03F 2200/261; H03F 2200/213
See application file for complete search history.

(56) References Cited

U.S. PATENT DOCUMENTS

| | | | |
|---|---|---|---|
| 4,525,856 A | | 6/1985 | Admiraal et al. |
| 4,536,616 A | | 8/1985 | Kaire |
| 4,603,357 A | * | 7/1986 | Ramirez .......... G11B 20/10203 327/31 |
| 5,021,747 A | * | 6/1991 | Isham .................... H03G 1/007 327/316 |
| 5,089,820 A | | 2/1992 | Gorai et al. |
| 5,363,147 A | | 11/1994 | Joseph et al. |
| 5,399,989 A | | 3/1995 | Chern |
| 6,121,908 A | | 9/2000 | Sevastopoulos et al. |
| 6,188,250 B1 | * | 2/2001 | Voornnan ................ G01R 19/04 327/58 |
| 6,266,423 B1 | * | 7/2001 | Werrbach ............. H03G 1/0064 381/106 |
| 6,382,511 B1 | | 5/2002 | Tang et al. |
| 6,429,988 B1 | | 8/2002 | Bhaumik et al. |
| 6,654,248 B1 | | 11/2003 | Fishley et al. |
| 6,822,507 B2 | | 11/2004 | Buchele |
| 6,975,193 B2 | | 12/2005 | Knieser et al. |
| 7,088,981 B2 | | 8/2006 | Chang |
| 7,171,010 B2 | | 1/2007 | Martin et al. |
| 7,230,555 B2 | | 6/2007 | Enrico et al. |
| 7,286,811 B2 | | 10/2007 | Kral |
| 7,304,679 B1 | | 12/2007 | Johnson et al. |
| 7,386,074 B1 | | 6/2008 | Venkatesh et al. |
| 7,391,873 B2 | | 6/2008 | Deruginsky et al. |
| 7,522,193 B2 | | 4/2009 | Itani et al. |
| 7,548,626 B2 | | 6/2009 | Stenberg et al. |
| 7,589,766 B2 | | 9/2009 | Itani et al. |
| 7,646,883 B2 | | 1/2010 | Kogure et al. |
| 7,663,432 B2 | | 2/2010 | Prandi et al. |
| 7,697,702 B2 | | 4/2010 | Akino |
| 7,719,595 B1 | | 5/2010 | Johnson et al. |
| 7,734,272 B2 | | 6/2010 | Kral |
| 7,761,067 B1 | | 7/2010 | Tsai et al. |
| 7,986,182 B2 | | 7/2011 | Prandi et al. |
| 8,004,350 B2 | | 8/2011 | Draxelmayr |
| 8,036,401 B2 | | 10/2011 | Poulsen et al. |
| 8,067,958 B2 | | 11/2011 | Draxelmayr |
| 8,199,927 B1 | | 6/2012 | Raftery |
| 8,200,179 B1 | | 6/2012 | Mosinskis et al. |
| 8,325,949 B2 | | 12/2012 | Qian et al. |
| 8,374,363 B2 | | 2/2013 | Onishi |
| 8,488,812 B2 | | 7/2013 | David et al. |
| 8,625,809 B2 | | 1/2014 | Josefsson et al. |
| 8,638,249 B2 | | 1/2014 | Kropfitsch et al. |
| 9,413,317 B2 | | 8/2016 | Kropfitsch et al. |
| 2002/0071578 A1 | | 6/2002 | Van Der Zwan et al. |
| 2003/0155966 A1 | | 8/2003 | Harrison |
| 2006/0083392 A1 | | 4/2006 | Akino |
| 2006/0108530 A1 | | 5/2006 | Le Touneur |
| 2006/0126865 A1 | * | 6/2006 | Blamey .................. H03G 9/005 381/102 |
| 2006/0265159 A1 | * | 11/2006 | Smith .................... G01D 3/036 702/66 |
| 2007/0024385 A1 | * | 2/2007 | Greenberg ................ H03L 5/00 331/158 |
| 2007/0076904 A1 | | 4/2007 | Deruginsky et al. |
| 2007/0101816 A1 | | 5/2007 | Cuffe et al. |
| 2008/0075306 A1 | | 3/2008 | Poulsen et al. |
| 2009/0003629 A1 | | 1/2009 | Shajaan et al. |
| 2009/0110213 A1 | * | 4/2009 | Holzmann ........... H04R 19/016 381/95 |
| 2009/0134501 A1 | | 5/2009 | Ganitzer et al. |
| 2009/0316916 A1 | * | 12/2009 | Haila ..................... H04R 3/005 381/57 |
| 2009/0316935 A1 | | 12/2009 | Furst et al. |
| 2010/0086162 A1 | | 4/2010 | Nielsen et al. |
| 2010/0135508 A1 | * | 6/2010 | Wu ......................... H04R 3/00 381/122 |
| 2010/0310096 A1 | | 12/2010 | Josefsson et al. |
| 2010/0315272 A1 | | 12/2010 | Steele et al. |
| 2010/0322440 A1 | * | 12/2010 | Chiu ...................... H03F 3/187 381/120 |
| 2011/0056302 A1 | | 3/2011 | Lutz |
| 2011/0074509 A1 | * | 3/2011 | Samavedam ............ H03F 1/14 330/253 |
| 2011/0142261 A1 | | 6/2011 | Josefsson et al. |
| 2011/0150243 A1 | | 6/2011 | Onishi |
| 2011/0175243 A1 | | 7/2011 | Jo et al. |
| 2011/0293115 A1 | | 12/2011 | Henriksen |
| 2012/0043974 A1 | | 2/2012 | Jeroen et al. |
| 2012/0133411 A1 | * | 5/2012 | Miao ...................... H03G 3/3089 327/306 |
| 2012/0250881 A1 | | 10/2012 | Mulligan |
| 2012/0250910 A1 | * | 10/2012 | Shajaan ................... H04R 3/00 381/174 |
| 2012/0250925 A1 | | 10/2012 | Lillelund |
| 2013/0015919 A1 | | 1/2013 | Kropfitsch et al. |
| 2013/0051582 A1 | | 2/2013 | Kropfitsch et al. |
| 2014/0093089 A1 | * | 4/2014 | Gasparini ............ H04R 19/013 381/59 |
| 2014/0320204 A1 | * | 10/2014 | Kohsiek ................ H03H 11/245 327/581 |

FOREIGN PATENT DOCUMENTS

| | | |
|---|---|---|
| CN | 1975410 A | 6/2007 |
| CN | 101507105 A | 8/2009 |
| CN | 101771385 A | 7/2010 |
| CN | 101854575 A | 10/2010 |
| DE | 202011106756 U1 | 4/2012 |
| EP | 1906704 A1 | 4/2008 |
| KR | 1020060113925 A | 11/2006 |
| KR | 1020070021148 A | 2/2007 |
| KR | 1020080063267 A | 7/2008 |
| WO | 0178446 | 10/2001 |
| WO | WO-0178446 A1 * | 10/2001 ............ H04R 25/00 |
| WO | 2009135815 A1 | 11/2009 |

OTHER PUBLICATIONS

Feng, P., et al., "History of the High-Voltage Charge Pump," Book Excerpt, Nov. 2006, pp. 1-9, Chapter 1, Professional Engineering 6X9, Charge Pump Circuit Design.

Harrison, R. R., et al., "A Low-Power Low Noise CMOS Amplifier for Neural Recording Applications," IEEE Journal of Solid-State Circuits, Jun. 2003, pp. 958-965, vol. 38, No. 6.

Harrison, R.R., "Integrated Circuits for Neural Interfacing," Circuits for Emerging Technologies, Feb. 15, 2008, pp. 1-12.

(56) References Cited

OTHER PUBLICATIONS

Vittoz, E., et al., "CMOS Analog Integrated Circuits Based on Weak Inversion Operation," IEEE Journal of Solid-State Circuits, vol. Sc-12, No. 3, Jun. 1977, pp. 224-231.

* cited by examiner

SYSTEM AND METHOD FOR LOW DISTORTION CAPACITIVE SIGNAL SOURCE AMPLIFIER

This application is a divisional of U.S. patent application Ser. No. 14/935,072, filed Nov. 6, 2015, which is a divisional application of U.S. patent application Ser. No. 13/217,890, filed on Aug. 25, 2011, now U.S. Pat. No. 9,236,837, which applications are hereby incorporated herein by reference in their entirety.

TECHNICAL FIELD

This invention relates generally to semiconductor circuits and methods, and more particularly to an amplifier for a low distortion capacitive signal source.

BACKGROUND

Audio microphones are commonly used in a variety of consumer applications such as cellular telephones, digital audio recorders, personal computers and teleconferencing systems. In particular, lower-cost electret condenser microphones (ECM) are used in mass produced cost sensitive applications. An ECM microphone typically includes a film of electret material that is mounted in a small package having a sound port and electrical output terminals. The electret material is adhered to a diaphragm or makes up the diaphragm itself. Most ECM microphones also include a preamplifier that can be interfaced to an audio front-end amplifier within a target application such as a cell phone. Another type of microphone is a microelectro-mechanical Systems (MEMS) microphone, which can be implemented as a pressure sensitive diaphragm is etched directly onto an integrated circuit.

Environmental sound pressure levels span a very large dynamic range. For example, the threshold of human hearing is at about 0 dBSPL, conversational speech is at about 60 dBSPL, while the sound of a jet aircraft 50 m away is about 140 dBSPL. While the diaphragm of a microphone, such as a MEMS microphone, may be able to withstand high intensity acoustic signals and faithfully convert these high intensity acoustic signals into an electronic signal, dealing with such high-level signals poses some difficulties. For example, many amplifiers and preamplifiers for acoustic microphones are optimized for a particular dynamic range. As such, these systems may not be able to handle the full audio range without adding significant distortion.

SUMMARY OF THE INVENTION

According to an embodiment, a method includes amplifying a signal provided by a capacitive signal source to form an amplified signal, detecting a peak voltage of the amplified signal, and adjusting controllable impedance coupled to an output of the capacitive signal source in response to detecting the peak voltage. The controllable impedance is adjusted to a value inversely proportional to the detected peak voltage.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely an amplifier for a capacitive signal source such as a MEMS or an electret condenser microphone (ECM). The invention may also be applied, however, to other types of circuits and systems, such as audio systems, communication systems, sensor systems and other systems that interface to high impedance signal sources.

In an embodiment, an amplifier maintains a large dynamic range of a capacitive signal source, such as a microphone, by automatically adjusting the signal level at the input to the amplifier. In some embodiments, the input signal level is controlled by adjusting an impedance coupled to the input of the amplifier. For example, in one embodiment, the input level is adjusted by controlling a capacitance coupled to the input of the amplifier. In another embodiment, the input level is adjusted by controlling a resistance coupled to the input of the amplifier, which results in an adjustable highpass network. Alternatively, other impedance types may be used at the input to the amplifier. In a further embodiment, the input level is controlled by adjusting a bias source to the capacitive sensor, which adjusts the acoustic to electric signal gain of the capacitive sensor itself.

In some embodiments, the microphone or capacitive sensor signal level is sensed at an output of an amplifier stage using a peak detector. The amplitude of the input signal is then adjusted until the output of the amplifier stage is less than peak value determined by the peak detector. In some embodiments, the amplitude of the input signal is adjusted when a zero crossing detector detects a zero crossing of the input signal or an amplified input signal.

Figure 1A:
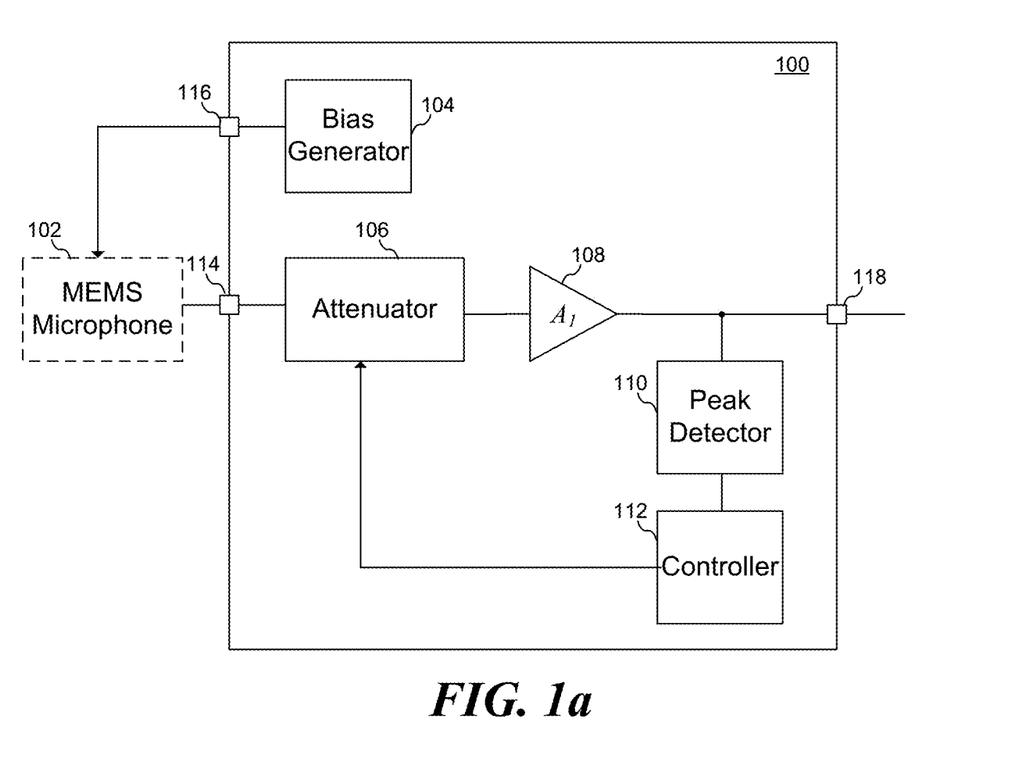
FIGS. 1a-1b illustrate amplifier integrated circuits (ICs) according to embodiments of the present invention.

FIG. 1a illustrates embodiment amplifier integrated circuit (IC) 100 configured to be coupled to MEMS microphone 102, which is shown in dotted lines to indicate that microphone 102 is not necessarily included on IC 100. In some embodiments, however, microphone 102 may also be included on IC 100. In alternative embodiments, other microphone types, such as ECM microphones, or other types of capacitive sensor circuits may be used in place of MEMS microphone 102.

IC 100 has attenuator 106, amplifier 108, peak detector no, controller 112 and bias generator 104. Amplifier 108 has one or more stages that amplify the output of MEMS microphone 102 coupled to IC 100 via input pad 114. In some embodiments, amplifier 108 may be implemented, for example, as described in co-pending application Ser. No. 13/183,193, entitled System and Method for Capacitive Signal Source Amplifier, filed on Jul. 14, 2011, which application has been incorporated by reference herein in its entirety. Alternatively, amplifier 108 may be implemented according to techniques known in the art. In an embodiment, amplifier 108 outputs the amplifier microphone signal to output pad 118. Alternatively, the amplifier output signal is not coupled to a pad, but is used internally. For example, in some embodiments, an analog-to-digital (A/D) converter is used to convert the output amplifier 108 into the digital domain.

Peak detector no detects peak signals at the output of amplifier 108 and controller 112 controls sets attenuator 106 according to the output of peak detector no. In some embodiments, attenuator 106 is implemented as a variable impedance coupled to the input of amplifier 108. In one embodiment, as will be described below, attenuator 106 is a variable capacitance implemented by using a switchable capacitor array. In further embodiment, attenuator 106 is a variable resistance implemented using switchable resistors, as will also be described below.

In some embodiments, for example in embodiments using a MEMS microphone, bias generator 104 provides a bias voltage for microphone 102 itself at pin 116. In some embodiments, this bias voltage may be between about 3V and about 60V depending on the particular microphone and system implementation. Alternatively, other voltage ranges may be used. In further embodiments, bias generator 104 may be omitted if microphone or sensor 102 does not require a bias voltage or if the required bias voltage is provided elsewhere. It should be further appreciated that the components on IC 100 may be implemented using more than one component and/or more than one IC in alternative embodiments.

Figure 1B:
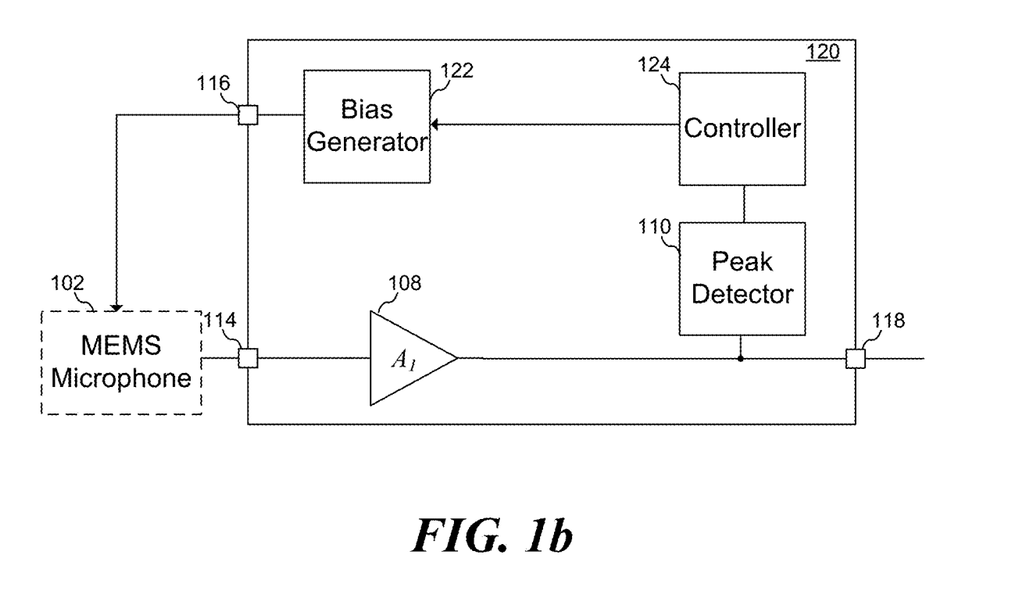

FIG. 1b illustrates embodiment IC 120, in which the input signal to amplifier 108 is controlled via bias generator 122. In an embodiment, controller 124 controls bias generator 122, which provides a bias voltage to MEMS microphone 102. In some embodiments, the gain of MEMS microphone 102 is proportional to the provided bias voltage. By varying the bias voltage in response to the output of peak detector no, gain control by varying the signal level at the input to amplifier 108 may be achieved.

Figure 2A:
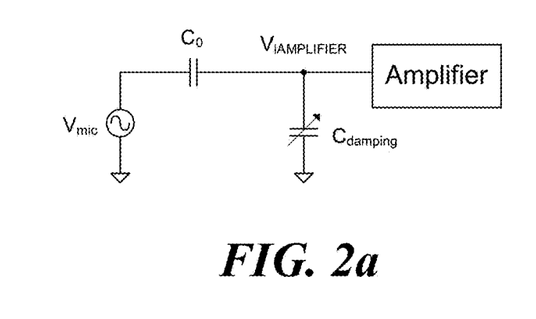
FIGS. 2a-2b illustrate amplifier schematics according to an embodiment of the present invention using a switchable capacitor attenuator.

In an embodiment, attenuation of the input signal is achieved by providing a variable capacitance at the input of the microphone or sensor amplifier. FIG. 2a illustrates the concept of attenuating the output of the microphone or capacitive sensor with a variable capacitance. Voltage source $V_{mic}$ represents the output voltage and capacitance $C_o$ represents the series capacitance of the microphone and/or capacitive sensor itself. It should be appreciated that $V_{mic}$ and $C_o$ is a simplified model of the microphone or capacitive sensor, which may be modeled by further components, such as parasitic capacitances, resistances and inductances. Variable capacitance $C_{damping}$ represents a variable damping capacitance, and voltage $_{iAMPLIFIER}$ represents an input voltage to the amplifier. In an embodiment, voltage $V_{iAMPLIFIER}$ can be expressed as:

$$V_{iAMPLFIER} = \frac{V_{mic}C_0}{C_0 + C_{damping}}.$$

As can be seen by the above equation, amplifier input amplitude $V_{iAMPLIFIER}$ decreases as $C_{damping}$ increases, therefore, amplifier input amplitude $V_{iAMPLIFIER}$ may be controlled as a function of $C_{damping}$.

Figure 2B:
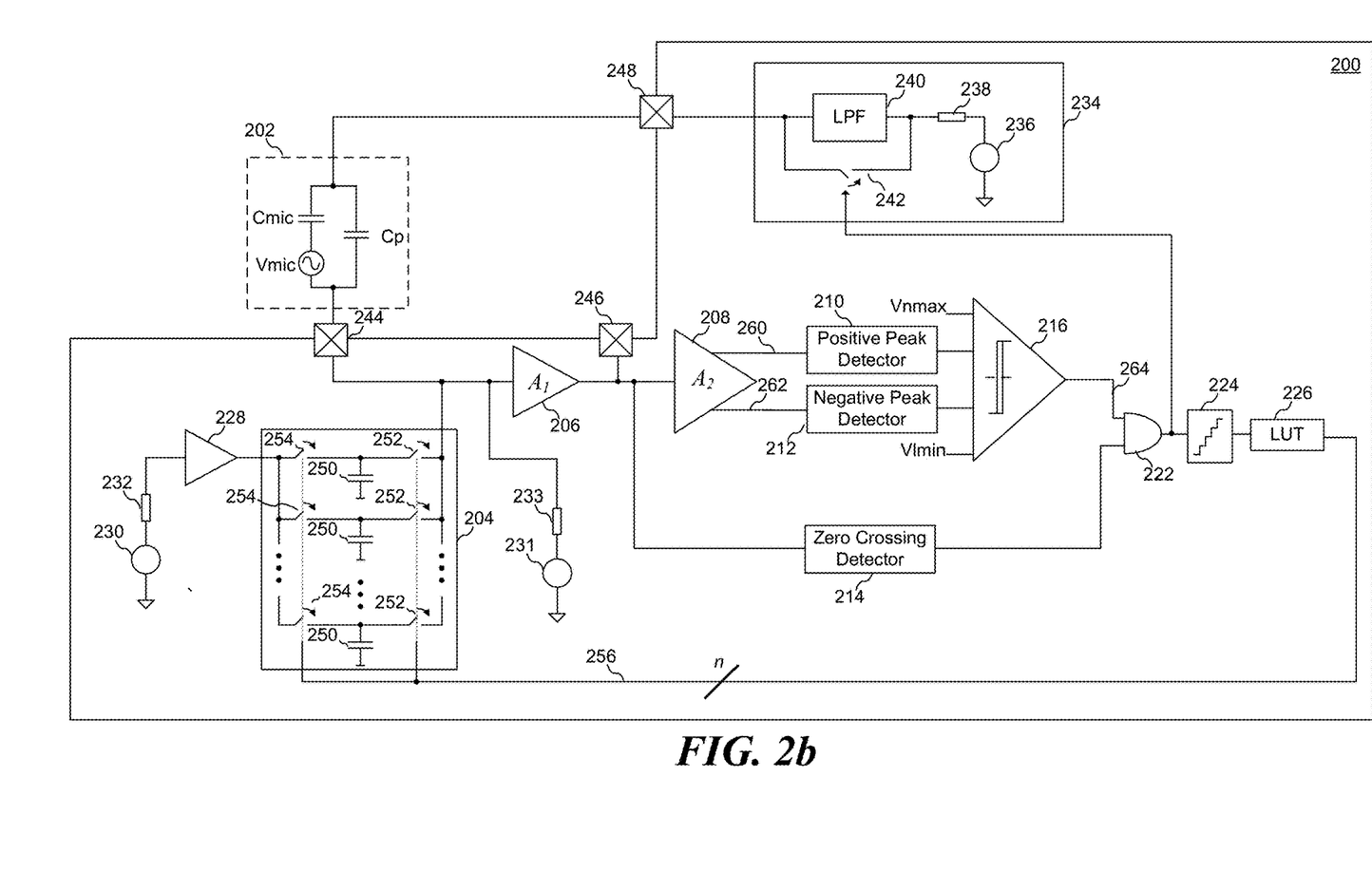

FIG. 2b illustrates IC 200 according to an embodiment of the present invention. In some embodiments, components of IC 200 may be used to implement the functionality of IC 100 illustrated in FIG. 1a. Here, the attenuator is implemented as switched capacitor array 204. In an embodiment, IC 200 interfaces to MEMS microphone 202, or other type of capacitive sensor via amplifier input pin 244 and bias pin 248. Amplifier 206 serves as the microphone amplifier and produces an output signal at pin 246. In some embodiments, amplifier 206 has a differential output signal and produces the differential output signal on a pair of pins. In other embodiments, the output of amplifier 206 is used on-chip and may be converted into the digital domain using an A/D converter (not shown). The input to amplifier 206 is biased by a bias generator represented by voltage source 231 and series resistor 233. In embodiments, this bias generator may be implemented using biasing techniques known in the art.

Amplifier 208 performs a single ended to differential conversion of the output of amplifier 206. By converting the single ended output of amplifier 206 to a differential signal, the resulting signal is made to be more insensitive to disturbances, such as power supply disturbances. In embodiments where amplifier 206 already produces a differential output signal, amplifier 208 may be omitted. Positive peak detector 210 and negative peak detector 212 are driven by outputs of 260 and 262 of amplifier 208, respectively. In an embodiment, positive and negative peak detectors 210 and 212 hold their peak values for a limited period of time, for example, between about 10 µs and about 1 ms. Positive and negative peak detectors 210 and 212 may be implemented using as shown in FIG. 5b and discussed further below. In an alternative embodiment, positive and negative peak detectors 210 and 212 may have differential, rather than single ended inputs.

Zero crossing detector 214 is coupled to the output of amplifier 206. In an embodiment, the output of zero crossing detector 214 is used to ensure that switch settings of capacitor array 204 are only changed when a zero crossing is detected, thereby reducing audible distortion during a change of input attenuator setting. Alternatively, the input of zero crossing detector 214 may be coupled to other points in the signal chain, such as the output of single ended to differential converter 208. In further alternative embodiments of the present invention, zero crossing detector 214 may be omitted.

Differential comparator 216 compares the outputs of positive peak detector 210 and negative peak detector 212 with fixed thresholds Vnmax and Vlmin. In an embodiment, these fixed thresholds are set to correspond to an equivalent input pressure of between about 114 dBSPL and about 118 dBSPL. The absolute values of these thresholds depend on microphone sensitivity, package characteristics, bias conditions and other factors. Alternatively, thresholds corresponding to other sound pressure ranges may be used. Comparator 216 may be implemented using Schmitt triggers, however, in alternative embodiments; other comparator types may be used. In the illustrated embodiment of FIG. 2b, comparator 216 is implemented using a differential implementation, in that the differential output of single ended to differential conversion block 208 is directly compared to a maximum positive differential signal stored in positive peak detector 210 and a maximum negative differential signal stored in negative peak detector 214.

Outputs of comparator 216 generates peak detect signal 264, which is ANDed with the output of zero crossing detector via AND gate 222. It should be appreciated that logic gate 222 is illustrative of a logic function that may be implemented in a variety of ways known in the art.

The output of AND gate, representing a detected peak at a detected zero crossing is coupled to the input of up/down counter 224. In an embodiment, a detected peak increments up/down counter 224 and a lack of a detected peak decrements up/down counter 224. The decrementation of the up/down counter goes down to a defined limit, which corresponds to the case in which no damping capacitor is connected to the input. This is done if comparator 216 always indicates that the input signal is below the threshold levels. In some embodiments, down-counting takes longer than the up-counting. In an embodiment, the up-count and down-count rates are programmable. These rates may be selected to be in a range that does not produce audible artifacts. For example, in some embodiments, the rates are chosen to be between about 50 Hz and 200 Hz. Alternatively, other rates outside of this range may be used.

Lookup table (LUT) 226 is coupled to the output of up/down counter. In embodiments, LUT 226 outputs a binary word, which is decoded by a decoder (not shown) in capacitor array 204 to connect and disconnect capacitors according to a desired attenuation. Alternatively, LUT may output the decoded switch states for capacitor array 204 directly.

In an embodiment, bias generator 234, represented by voltage source 236, resistor 238 and lowpass filter 240, outputs a bias voltage for microphone 202 on pin 248. Bias generator 234 may be implemented using, for example a charge pump and/or other techniques known in the art. In an embodiment, lowpass filter, which has a corner frequency in the mHz to Hz region, is bypassed via switch 242 during a change in capacitor array 204 setting. Bypassing lowpass filter 240 allows the biasing of microphone 202 to settle quickly after a change in the setting of capacitor array 204.

In an embodiment, capacitor array 204 includes capacitors 250 coupled to the input of amplifier 206 via switches 252, which are selected according to digital control signal 256. In one embodiment, 32 capacitors are used. Alternatively, greater or fewer capacitors may be used depending on the application and its specifications. Capacitors 250 may be arranged in groups of unit value capacitors arranged in binary weighted sub-arrays, and/or may be arranged individually in arrays having equal values of capacitors and selected using thermometer coded selection. Alternatively, other capacitors arrangement schemes and grouping may be used or a combination thereof.

In an embodiment, the capacitors that are not selected to be coupled to the input of amplifier 206 are coupled to the output of amplifier 228, which buffers a bias circuit that replicates the input bias voltage of amplifier 206. This replica bias is represented by voltage source 230 in series with resistor 232. In embodiments, the bias voltage generator modeled by voltage source 230 and resistor 232 is implemented in a similar manner as the bias voltage generator modeled by voltage source 231 and resistor 233.

Figure 3A:
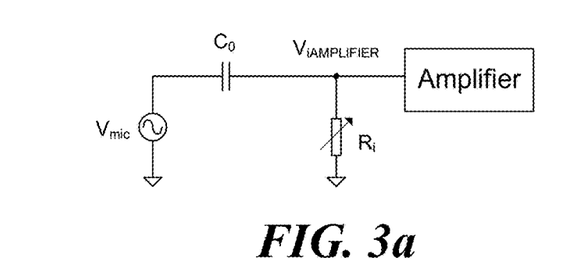
FIGS. 3a-3d illustrate amplifier schematics and a frequency response plot according to an embodiment of the present invention using a variable resistance attenuator.
Figure 3B:
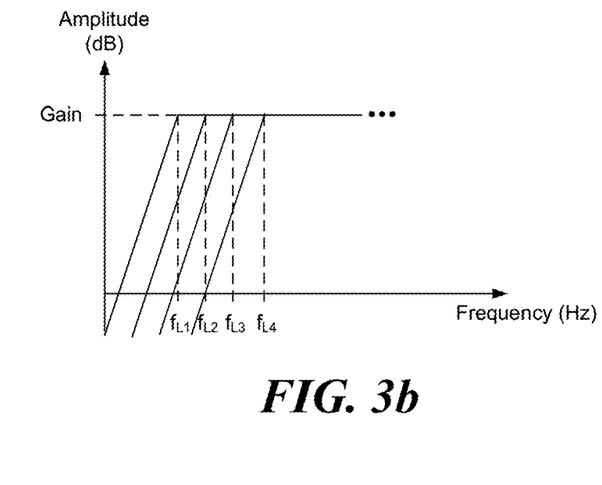
Figure 3C:
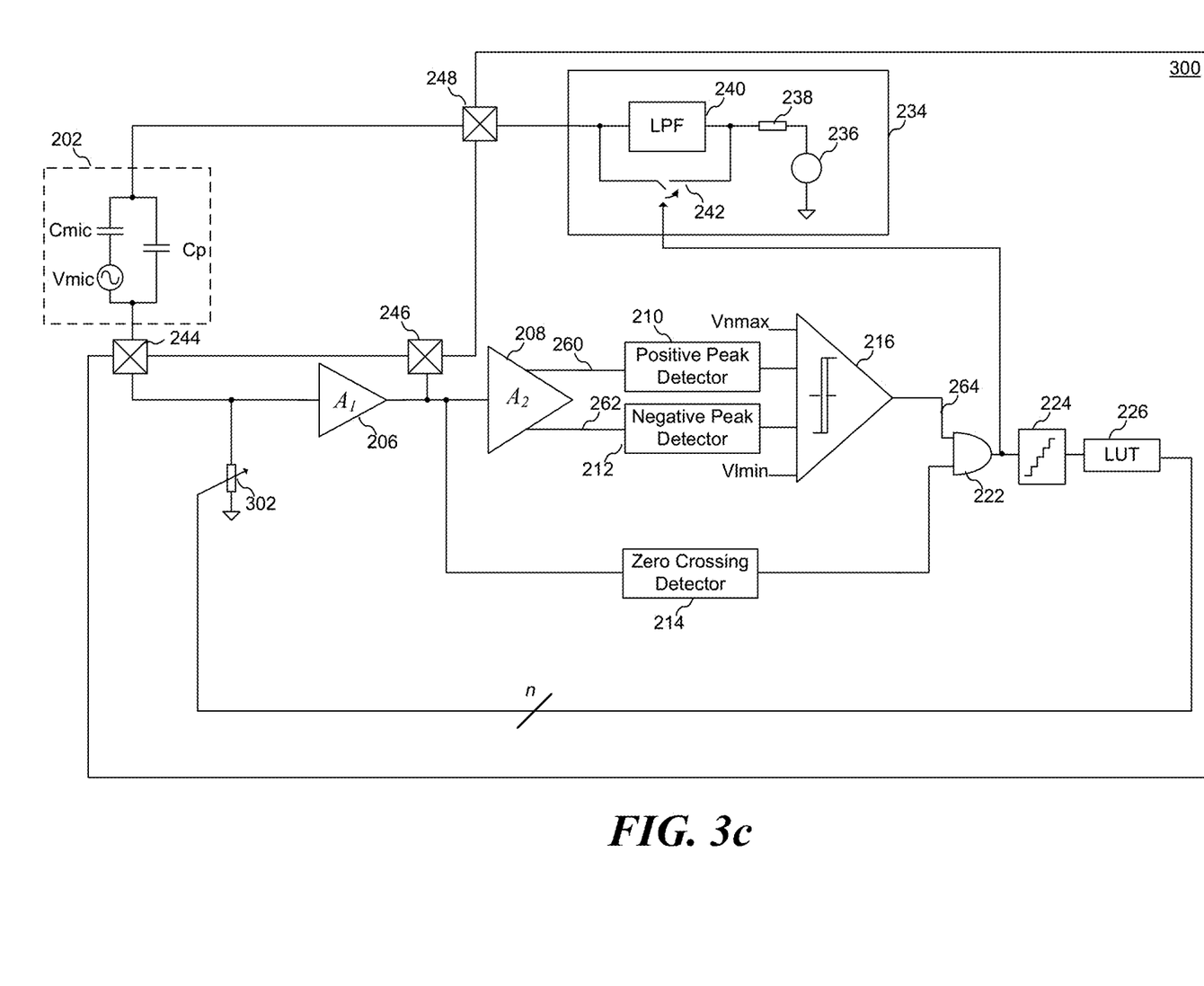
Figure 5A:
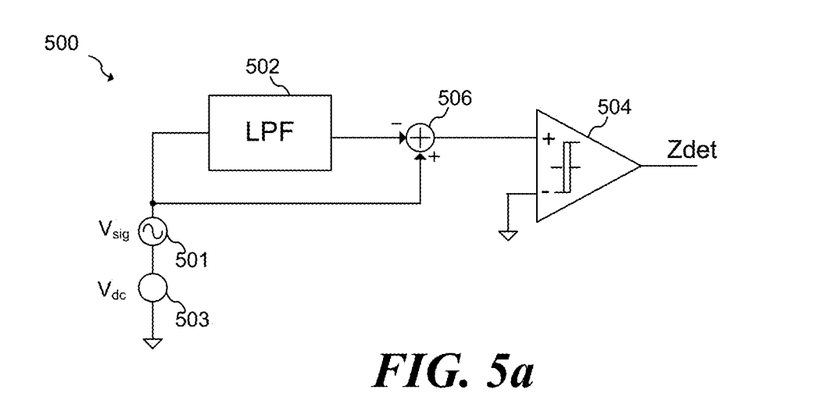
FIGS. 5a-5c illustrate an embodiment zero-crossing detector, peak-detector, and two-phase clock timing diagram.
Figure 5B:
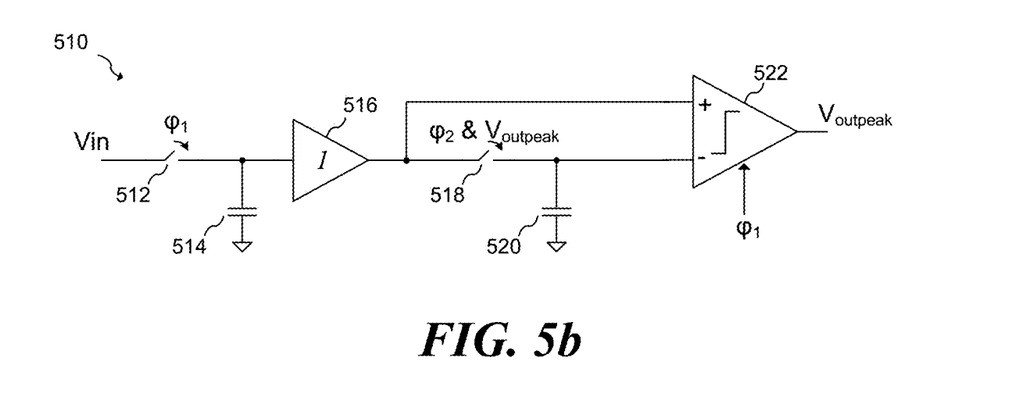

FIG. 5a illustrates embodiment zero crossing circuit 500 that may be used to implement zero crossing detector 214 in FIGS. 2b and 3c. The input signal to peak detector 500 is represented by AC voltage source 501 in series with DC voltage source 503. Lowpass filter 502 filters the input signal, and summing junction 506 subtracts the lowpass filtered input signal from an unfiltered version of the input signal. In an embodiment, the corner frequency of lowpass filter 502 ranges between about 1 mHz and about 10 Hz. Alternatively, other corner frequencies may be used depending on the particular application and its specifications. The combination of lowpass filter 502 and 506 functions as a high pass network that filters out the dc bias voltage as well as low frequency wander. Comparator 504 compares the output of summing junction with ground or a reference voltage. Signal Zdet is accordingly activated when Vsig changes polarity. In embodiments, zero crossing detector may be implemented using circuit topologies known in the art. In some embodiments, comparator 504 is implemented using a Schmitt trigger.

Figure 5C:
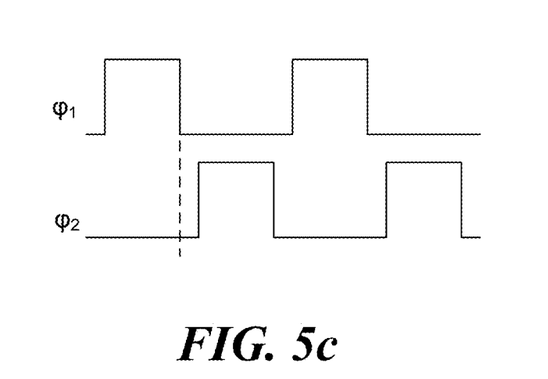

FIG. 5b illustrates embodiment peak detect circuit 510 that may be used to implement peak detectors 210 and 212 in FIGS. 2b and 3c. Input voltage Vin is sampled on capacitor 514 using switch 512 that is active during phase $\varphi_1$. The output of amplifier 516, buffers the voltage sampled on capacitor 514, is sampled on capacitor 520 via switch 518. Comparator 522 compares the output of buffer voltage 516 with the sampled voltage on capacitor 520 to provide peak voltage $V_{outpeak}$. Comparator 522 is sampled during phase $\varphi_1$ and switch 518 is active when phase $\varphi_2$ and comparator 522 output $V_{outpeak}$ are both active. In embodiment, circuit 510 may be implemented using, for example, switch capacitor circuit techniques known in the art. FIG. 5c illustrates an embodiment timing diagram of non-overlapping phases $\varphi_1$ and $\varphi_2$. In embodiments, phases $\varphi_1$ and $\varphi_2$ may be generated using techniques known in the art.

In an embodiment, attenuation of the input signal is achieved by providing a variable resistance at the input of the microphone or sensor amplifier. FIG. 3a illustrates the concept of attenuating the output of the microphone or capacitive sensor with a variable resistance. Voltage source Vmic represents the output voltage and capacitance $C_o$ represents the series capacitance of the microphone and/or capacitive sensor itself. As noted above, it should be appreciated that Vmic and $C_o$ is a simplified model of the microphone or capacitive sensor and may include other components, such as parasitic capacitance. Variable resistor $R_i$ represents a variable resistance, and voltage $V_{iAMPLIFIER}$ represents an input voltage to the Amplifier.

FIG. 3b illustrates a series of amplitude transfer functions $V_{iAMPLIFIER}(s)/V_{mic}(s)$ with respect to $R_i$. Lower corner frequencies $f_{L1}$, $f_{L2}$, $f_{L3}$ and $f_{L4}$ correspond to various resistance values for variable resistor $R_i$, such that there is a corresponding increase in lower corner frequency for a decrease in resistance $R_i$. By adjusting the lower corner frequency $f_L$, peak amplitudes of $V_{iAMPLIFIER}$ may be controlled in some embodiments, for example in audio signals, such as speech signals, in which much energy is present in the lower frequencies.

FIG. 3c illustrates IC 300 according to an embodiment of the present invention. IC 300 is similar to IC 200 in FIG. 2b, with the exception that the attenuator is implemented using variable resistance 302 instead of capacitor array 204. In an embodiment, incoming high-level signals at the input of amplifier 208 are attenuated by variable resistance 302, which increases the lower corner frequency at which signals are attenuated. After a defined amount of time, for example, between about 10 μs and about 100 μs the high pass corner frequency is shifted back again to a lower frequency. If the output voltage swing at the output pad is below a defined voltage limit again, as detected by peak detectors 210 and 212, the internal counter is changed again and the original input impedance stays and a standard configuration for normal signal levels is again reached. In an embodiment, this standard configuration is an impedance between about 50 GΩ and about 500 GΩ.

Figure 3D:
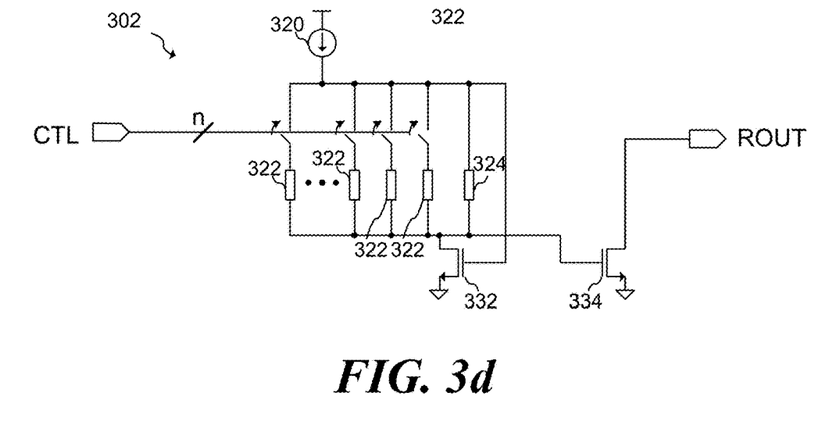

FIG. 3d illustrates a schematic of a possible implementation of embodiment variable resistance 302, which may be used as variable resistance 302 in IC 300 of FIG. 3c. Current source 320 provides a current source to a resistor array having switchable resistors 322 coupled between the gate and drain of NMOS transistor 332, whose individual resistors are switched in and out according to n-bit input control word CTL. In some embodiments, each individual bit in input word CTL is associated with a particular switchable resistor. Alternatively, input control word CTL may be decoded using a decoder (not shown). In an embodiment, the resistor array may further include non-switchable resistor 324 coupled between the gate and drain of NMOS transistor 332. The drain of transistor 332 is further coupled to the gate of output NMOS transistor 334, whose drain is coupled to the input of amplifier 208 in shown if FIG. 3c. In an embodiment, transistor 334 is biased in the sub-threshold region.

During operation, when the resistance between the drain of transistor 332 and current source 320 is reduced, the gate-source voltage of transistor 332 increases, which causes the gds of transistor 334 to increase. This results in a lower impedance at the input of amplifier 208 (FIG. 3c) and a shift of the lower corner frequency to higher frequencies, thereby causing an increased attenuation of the signal at the input to amplifier 208.

Figure 6A:
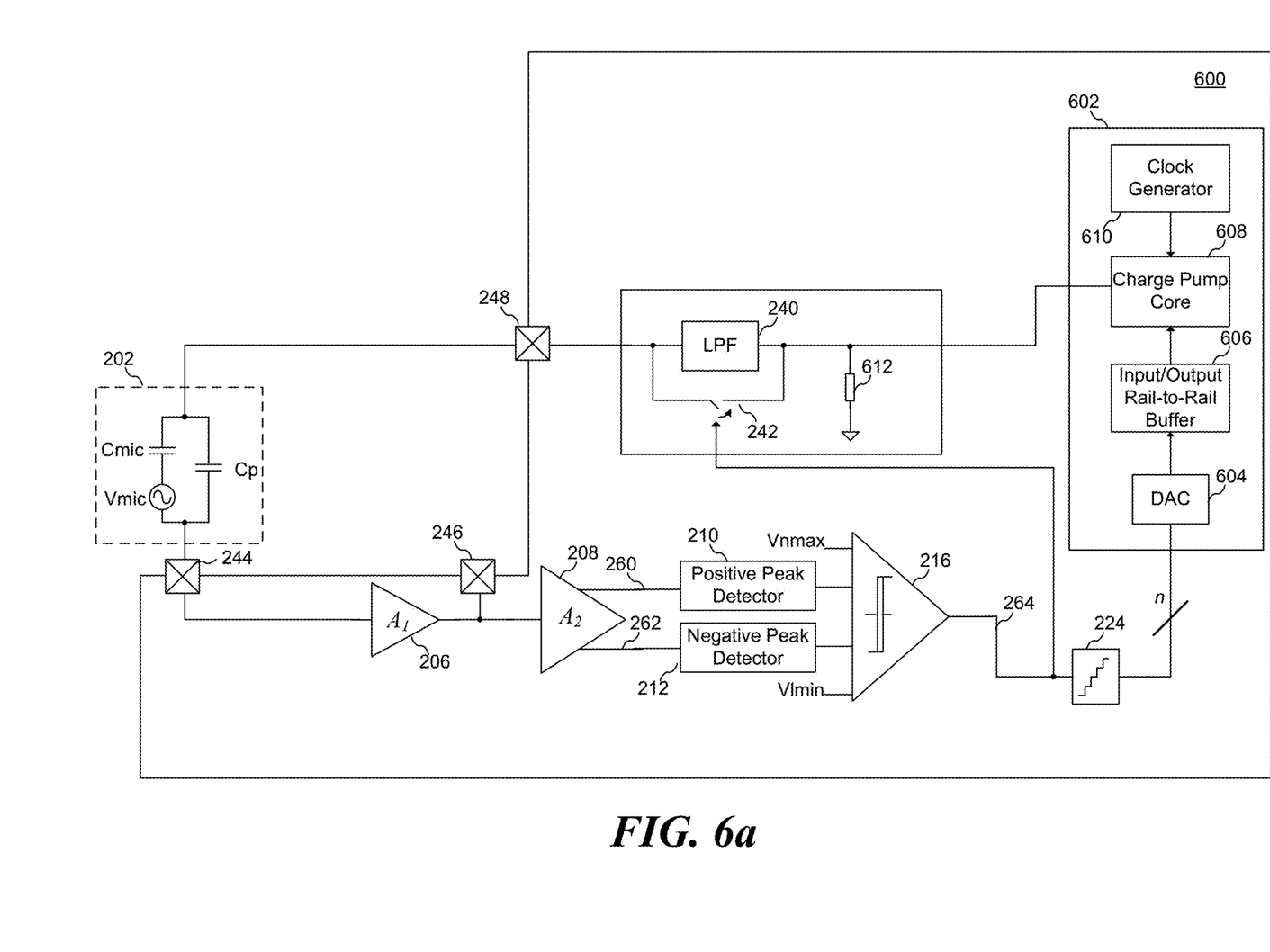
FIGS. 6a-6b illustrate amplifier schematics according to an embodiment of the present invention using a variable microphone bias.

FIG. 6a illustrates integrated circuit 600 in which the output level of microphone 202 is adjusted by adjusting the microphone bias voltage at node 248. Positive and negative peak detectors 210 and 212 operate as described in embodiments above. The output of up/down counter is fed into the input of DAC 604 in bias voltage adjustment block 602. Input/output rail to rail buffer 606 provides a reference voltage to charge pump 608 based on the output of DAC 604. Charge pump core 608 is further clocked by clock generator 610.

In an embodiment, the output of charge pump core is loaded by discharge resistor 612 and filtered by lowpass filter 240. In some embodiments, the bias voltage at pin 248 is continually adjusted during operation. Switch 242 bypassesing lowpass filter 240 may be activated when a voltage setting is changed and/or during startup.

Figure 6B:
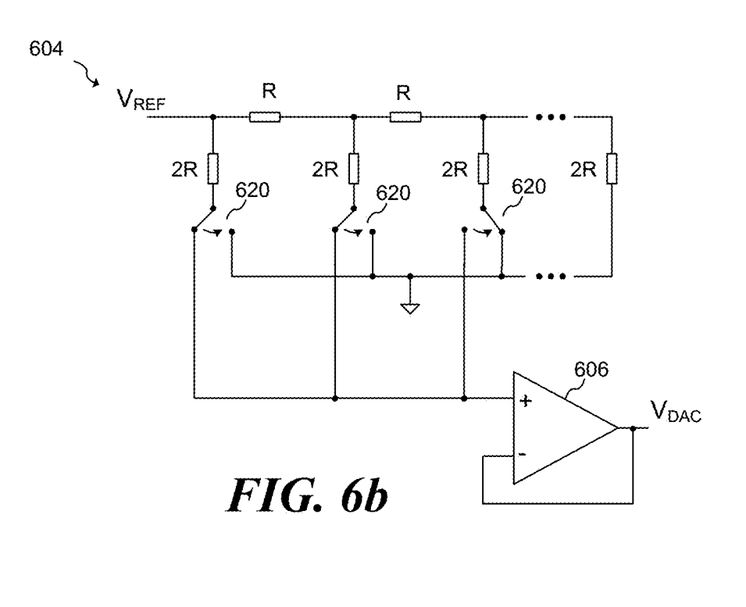

In an embodiment, the DAC 604 may be implemented using an R-2R ladder buffered by rail-to-rail buffer 606 to produce $V_{DAC}$ as shown in FIG. 6b. The states of switches 620 are determined by the digital input to DAC 604. In some embodiments, DAC 604 is a 5-bit or 6-bit DAC having 32 or 64 output levels; however, other resolutions may be used. In alternative embodiments, DAC architectures known in the art may be used.

Figure 7A:
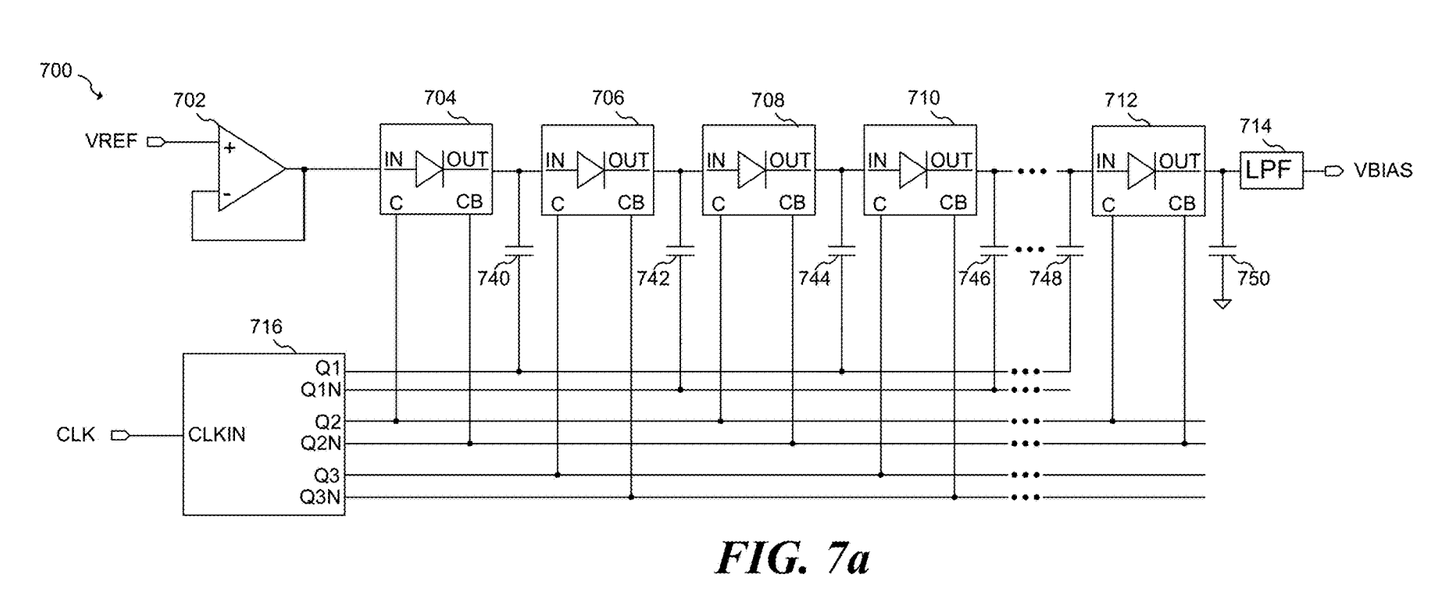
FIGS. 7a-7d illustrate schematics and a timing diagram of an embodiment microphone bias circuit.

FIGS. 7a-7d illustrate an embodiment bias circuit that may be used to implement voltage source 236 shown in FIGS. 2a and 3c, as well as charge pump core 608 and clock generator 610 shown in FIG. 6a. FIG. 7a illustrates a top-level schematic of MEMS bias circuit 700, which is used to provide a boosted voltage between about 3V and about 60V. Alternatively, voltages outside of this range are also possible depending on the particular MEMS microphone and/or capacitive sensor used. In an embodiment, a Dickson charge pump structure is used to provide boosted output voltage VBIAS. The charge pump is formed by capacitors 740, 742, 744, 746 and 748 coupled to functional diode blocks 704, 706, 708, 710 and 712. In one embodiment, nine functional diode blocks are used. Alternatively, any number of functional diode blocks may be used depending on the boosted voltage required. In an embodiment, reference voltage VREF is buffered by amplifier 702 and fed into first functional diode 704. In some embodiments, amplifier 702 corresponds to input/output rail-to-rail buffer 606 in FIGS. 6a and 6b directed toward gain control using an adjustable microphone bias voltage. Clock generator 716 provides clock signals Q1, Q1N, Q2, Q2N, Q3 and Q3N that drive capacitors 740, 742, 744, 746 and 748 and functional diode blocks 704, 706, 708, 710 and 712. The output of last functional diode block 712 is coupled to capacitor 750 and lowpass filter 714.

Figure 7B:
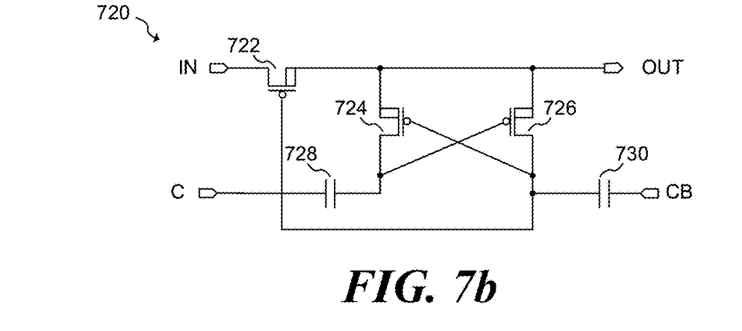

FIG. 7b illustrates embodiment functional diode block 720, which has PMOS devices 722, 724 and 726 and input coupling capacitors 728 and 730. PMOS device 722 is a pass transistor that coupled input IN of functional diode 720 to output OUT of functional diode 720. Cross coupled transistors 724 and 726 and input coupling capacitors 728 730 provides a boosted clock that shuts off transistor 722 at time during which the functional diode is in a non-conducting state. By using circuit 720, inefficiencies due to the threshold voltage of transistor 722 may be avoided. In alternative embodiments, a pn junction diode, a diode connected transistor, or other suitable device may be used in place of functional diode 720.

Figure 7C:
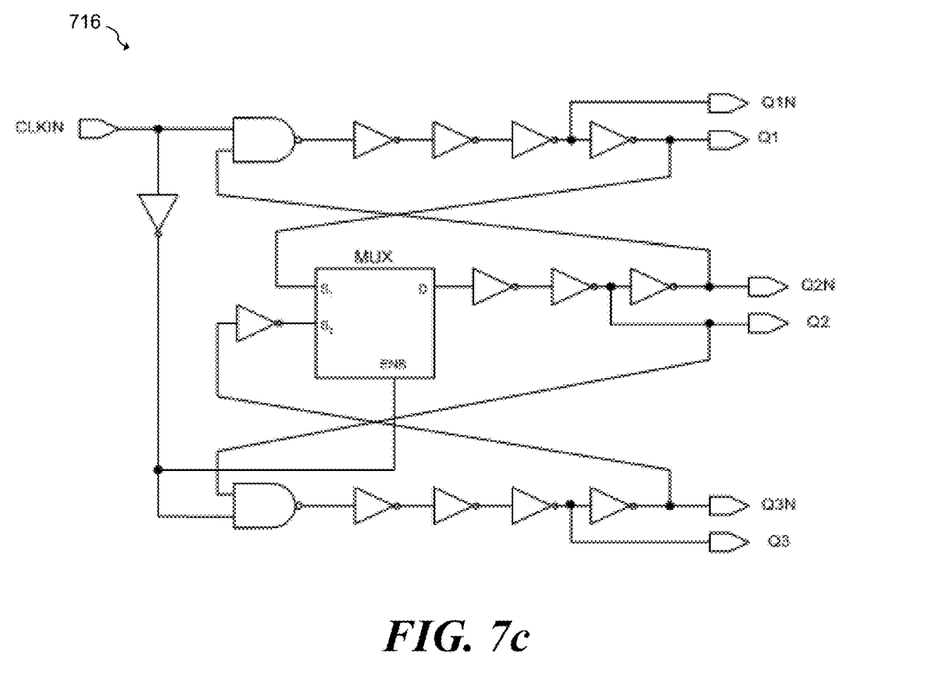
Figure 7D:
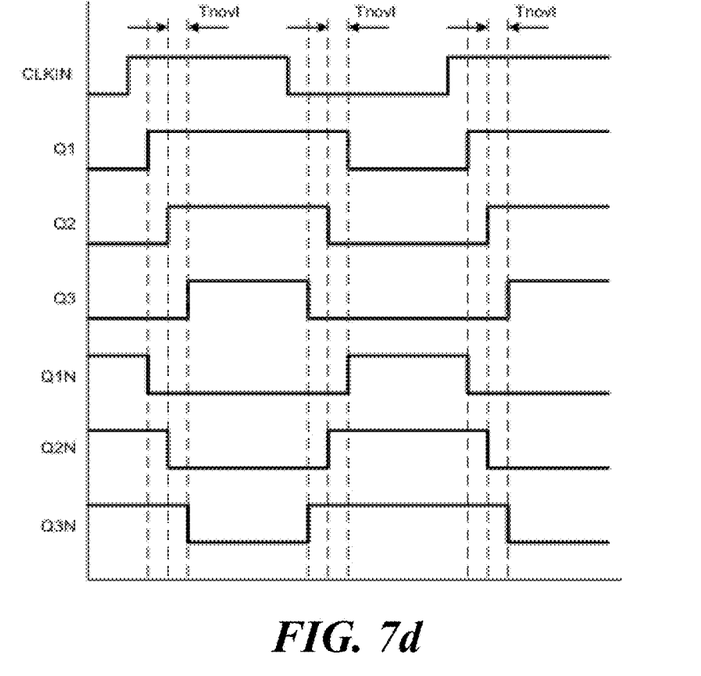

FIG. 7c illustrates a schematic of embodiment clock generator 716, which provides phased clocks for capacitors 740, 740, 742, 744, 746 and 748, and functional diodes 704, 706, 708, 710 and 712. FIG. 7d illustrates a timing diagram of clock generator 716. In an embodiment, clock signals Q1 and Q1N that drive capacitors 740, 740, 742, 744, 746 and 748 have the widest pulse width, clock signals Q2 and Q2N that drive some of the functional diodes have a narrower pulse width, and clock signals Q3 and Q3 that drive the remaining functional diodes have the narrowest pulse width. In an embodiment, the rising edge of Q2 with respect to Q1, the falling edge of Q1 with respect to Q2, the rising edge of Q3 with respect to Q2 and the falling edge of Q2 with respect to Q3 is delayed by Tnovl. By using an embodiment clock phasing scheme, such as the one illustrated in FIG. 7d, functional diodes 704, 706, 708, 710 and 712 are in a stable before the signals driving capacitors 740, 740, 742, 744, 746 and 748 are change state. In alternative embodiments, other clock phase relationships may be used.

Figure 4:
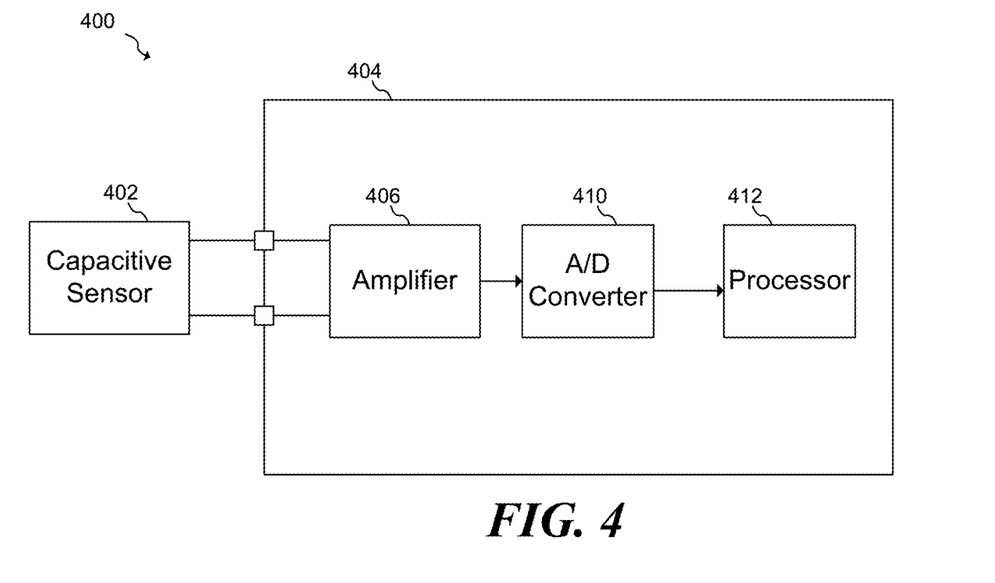
FIG. 4 illustrates a system according to an embodiment of the present invention.

FIG. 4 illustrates system 400 using embodiments of the present invention. Capacitive sensor 402 is coupled to integrated circuit 404 having amplifier 406 according to embodiments of the present invention described herein. In an embodiment, amplifier 406 is coupled to A/D converter 410. In some embodiments, A/D converter is implemented as an audio sigma-delta converter. In other embodiments, A/D converter can be, for example, a low frequency A/D suitable for sensor applications. In embodiments, the output of A/D converter is coupled to processor 412 to perform a useful function. Examples of possible applications achievable by system 400 include, but are not limited to telephone systems, digital recorders, and remote sensing systems.

In some embodiments, for example, capacitive sensor 402 can be a MEMS microphone or other capacitive sensor such as capacitive pressure sensor, an ECM, or another type of floating capacitive signal source. In alternative embodiments, capacitive sensor 402 can be included on integrated circuit 404. Furthermore, A/D converter 410 and/or processor 412 can be located separately from integrated circuit 404. In some embodiments, the functionality of integrated circuit 404 may be implemented using a single integrated circuit, or using a plurality of integrated circuits.

In an embodiment, a method includes amplifying a signal provided by a capacitive signal source to form an amplified signal, detecting a peak voltage of the amplified signal, and adjusting a controllable impedance coupled to an output of the capacitive signal source in response to detecting the peak voltage. The controllable impedance is adjusted to a value inversely proportional to the detected peak voltage. In an embodiment, the method may further include comparing the detected peak voltage to a predetermined threshold, and adjusting the controllable impedance may include decreasing the controllable impedance if the detected peak voltage exceeds the predetermined threshold, and increasing the controllable impedance if detected peak voltage does not exceed the predetermined threshold. In some embodiments, decreasing the controllable impedance includes decreasing the controllable impedance at a first rate, and increasing the controllable impedance comprises increasing the controllable impedance at a second rate. In some cases, the first rate is greater than the second rate and/or increasing the controllable impedance comprises increasing the controllable impedance up to a maximum value in a plurality of steps.

In an embodiment, adjusting the controllable impedance includes adjusting a capacitance coupled to the output of the capacitive signal source. Adjusting the capacitance may also include adjusting a capacitance of a capacitor array by coupling and decoupling capacitors to and from the output of the capacitive signal source. Adjusting the controllable impedance may also include adjusting a controllable resistance coupled to the output of the capacitive signal source.

In an embodiment, the method also includes detecting a zero crossing of the signal provided by the capacitive signal source, and adjusting the controllable impedance includes adjusting the controllable impedance when a zero crossing is detected. The capacitive signal source may include a MEMS microphone, and the adjustable impedance may be controlled such that a total harmonic distortion of the amplified signal is less than 10% for a 140 dBSPL acoustic input to the MEMS microphone. In some embodiments, the method includes biasing the MEMS microphone.

In an embodiment, a method includes amplifying a signal provided by a capacitive signal source to form an amplified signal, detecting a peak voltage of the amplified signal, and adjusting a controllable bias voltage of the capacitive signal source in response to detecting the peak voltage. The bias voltage of the capacitive signal source is adjusted to a value inversely proportional to the detected peak voltage. In some embodiments, the capacitive signal source may be a MEMS microphone, and the controllable bias is controlled such that a total harmonic distortion of the amplified signal is less than 10% for a 140 dBSPL acoustic input to the MEMS microphone.

In an embodiment, a system for amplifying a signal provided by a capacitive signal source includes a signal amplifier comprising an input node configured to be coupled to the capacitive signal source, a controllable attenuation circuit coupled to the input node of the signal amplifier that is configured to provide a controllable input impedance at the input node of the signal amplifier. The system also includes a signal detection circuit coupled to an output of the signal amplifier that is configured to detect peak signal values at the output of the signal amplifier, and a control circuit coupled between the signal detection circuit and the controllable attenuation circuit that is configured to adjust the controllable attenuation circuit in response to changes in detected peak signal values. In some embodiments, the signal detection circuit is configured to detect a positive peak signal value and a negative peak signal value.

In an embodiment, the signal detection circuit is further configured to detect a zero crossing of a signal at the output of the signal amplifier, and the control circuit is further configured to adjust the controllable attenuation circuit when the signal detection circuit detects a zero crossing. In some embodiments, the control circuit is further configured to command the controllable attenuation circuit to decrease the input impedance if the signal detection circuit detects a peak signal level greater than a threshold, and increase the input impedance up to a maximum value in several steps if the signal detection circuit does not detect a peak signal level greater than the threshold. The control circuit may command the controllable attenuation circuit to decrease the input impedance at a first rate and increase the input impedance at a second rate. In an embodiment, the first rate is greater than the second rate.

In an embodiment, the controllable attenuation circuit may include a selectable capacitor array coupled to the input node of the signal amplifier, and may also include comprises an adjustable resistance coupled to the input node of the signal amplifier. In some embodiments, the capacitive signal source is a MEMS microphone.

In an embodiment, a system for amplifying a signal provided by a capacitive signal source includes a signal amplifier having an input node configured to be coupled to the capacitive signal source, a controllable bias circuit configured to be coupled to a bias node of the capacitive signal source, a signal detection circuit coupled to an output of the signal amplifier, and a control circuit coupled between the signal detection circuit and the controllable bias circuit. The controllable bias circuit configured to provide a controllable bias voltage to the capacitive signal source, the signal detection circuit is configured to detect peak signal values at the output of the signal amplifier, and the control circuit is configured to adjust the controllable bias circuit in response to changes in detected peak signal values.

In some embodiments, the control circuit is further configured to command the controllable bias circuit to decrease controllable bias voltage if the signal detection circuit detects a peak signal level greater than a threshold, and increase the controllable bias voltage if the signal detection circuit does not detect a peak signal level greater than the threshold. The control circuit may command the controllable bias circuit to decrease the controllable bias voltage at a first rate and increase the controllable bias voltage at a second rate, where the first rate is greater than the second rate.

In an embodiment, the controllable bias circuit includes a digital-to-analog converter (DAC) coupled to an output of the control circuit, a charge pump circuit coupled to an output of the DAC, and a lowpass filter coupled between the charge pump circuit and an output of the controllable bias circuit. The capacitive signal source may include a MEMS microphone.

In an embodiment, an integrated circuit for amplifying a signal provided by a capacitive signal source includes a signal amplifier having an input node configured to be coupled to the capacitive signal source, and a controllable attenuation circuit coupled to the input node of the signal amplifier, a peak detector coupled to an output of the signal amplifier, and a comparator coupled to an output of the peak detector and the output of the signal amplifier. The comparator may be configured to compare an output of the peak detector with a threshold. The integrated circuit also includes a control circuit coupled between an output of the comparator and a control input of the controllable attenuation circuit.

In an embodiment, the control circuit includes a counter coupled to the output of the comparator, and a look-up table circuit coupled to the output of the counter the counter. The control circuit may be configured to increment if the output of the peak detector exceeds the threshold and decrement if the output of the peak detector does not exceed the threshold.

In an embodiment, the integrated circuit further includes a single-ended to differential conversion circuit coupled between the signal amplifier and the peak detector. The peak detector includes a positive peak detector and a negative peak detector, and the comparator includes a differential comparator configured to compare an output of the positive peak detector with a positive threshold, and an output of the negative peak detector with a negative threshold. The integrated circuit may also include a zero crossing detector coupled to the output of the signal amplifier. The control circuit is configured to adjust the controllable attenuation circuit when the zero crossing detector detects a zero crossing.

In an embodiment, the controllable attenuation circuit includes a plurality of capacitors and a plurality of switches coupled between the plurality of capacitors and the input of the signal amplifier, where the plurality of switches is controllable by the control circuit. In some embodiments, the controllable attenuation circuit includes a controllable resistor. This controllable resistor may include a first transistor coupled between the input of the signal amplifier and a reference voltage, a second transistor having a drain coupled to a gate of the first transistor, and a plurality of switchable resistors coupled between a gate of the second transistor and the drain of the second transistor, and a current source coupled to the gate of the second transistor. In an embodiment, the plurality of switchable resistors is controllable by the control circuit.

An advantage of embodiment systems includes the ability to process high acoustical input signals without introducing a high non-linearity in the system. For example, in one embodiment a total harmonic distortion (THD) of less than 10% may be achieved for a MEMS microphone at an acoustic input level of 140 dBSPL.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit for amplifying a signal provided by a capacitive signal source, the integrated circuit comprising:
   a signal amplifier comprising an input node configured to be coupled to the capacitive signal source;
   a controllable attenuation circuit coupled to the input node of the signal amplifier;
   a single-ended to differential conversion circuit having an input coupled to an output of the signal amplifier, wherein the single-ended to differential conversion circuit is configured to convert a single-ended signal at the output of the signal amplifier to a differential signal at a first output node and a second output node of the single-ended to differential conversion circuit;
   a peak detector coupled to the first output node and the second output node of the single-ended to differential conversion circuit, wherein the peak detector comprises a positive peak detector and a negative peak detector;
   a comparator coupled to an output of the positive peak detector and an output of the negative peak detector, wherein the comparator is configured to compare an output of the peak detector with a threshold, and the comparator comprises a differential comparator configured to compare the output of the positive peak detector with a positive threshold, and the output of the negative peak detector with a negative threshold; and
   a control circuit coupled between an output of the comparator and a control input of the controllable attenuation circuit.

2. The integrated circuit of claim 1, wherein the control circuit comprises:
   a counter coupled to the output of the comparator, the counter being configured to increment if the output of the peak detector exceeds the threshold and decrement if the output of the peak detector does not exceed the threshold; and
   a look-up table circuit coupled to the output of the counter.

3. The integrated circuit of claim 1, further comprising a zero crossing detector coupled to the output of the signal amplifier, wherein the control circuit is configured to adjust the controllable attenuation circuit when the zero crossing detector detects a zero crossing.

4. The integrated circuit of claim 1, wherein the controllable attenuation circuit comprises:
   a plurality of capacitors; and
   a plurality of switches coupled between the plurality of capacitors and the input node of the signal amplifier, the plurality of switches being controllable by the control circuit.

5. The integrated circuit of claim 1, wherein the controllable attenuation circuit comprises a controllable resistor.

6. The integrated circuit of claim 5, wherein the controllable resistor comprises:
   a first transistor coupled between the input node of the signal amplifier and a reference voltage;
   a second transistor having a drain coupled to a gate of the first transistor;
   a plurality of switchable resistors coupled between a gate of the second transistor and the drain of the second transistor, the plurality of switchable resistors controllable by the control circuit; and
   a current source coupled to the gate of the second transistor.

7. The integrated circuit of claim 1, wherein the control circuit is configured to:
   increase an attenuation of the controllable attenuation circuit at a first rate if a peak voltage detected by the peak detector exceeds the threshold, and
   decrease the attenuation at a second rate if detected peak voltage detected by the peak detector does not exceed the threshold, wherein the first rate is greater than the second rate.

8. A method comprising:
   amplifying a signal provided by a capacitive signal source to form a single-ended amplified signal;

converting the single-ended amplified signal to a differential amplified signal using a single-ended to differential conversion circuit;
detecting a peak voltage of the differential amplified signal using a positive peak detector and a negative peak detector;
comparing the detected peak voltage to a predetermined threshold using a differential comparator configured to compare an output of the positive peak detector with a positive threshold, and an output of the negative peak detector with a negative threshold; and
adjusting a controllable attenuator in response to detecting the peak voltage, an attenuation of the controllable attenuator being adjusted to a value proportional to the detected peak voltage, wherein adjusting the controllable attenuator comprises
increasing the attenuation at a first rate if the detected peak voltage exceeds the predetermined threshold, and
decreasing the attenuation at a second rate if detected peak voltage does not exceed the predetermined threshold, wherein the first rate is greater than the second rate.

9. The method of claim 8, wherein
the capacitive signal source comprises a MEMS microphone; and
the controllable attenuator is controlled such that a total harmonic distortion of the single-ended amplified signal is less than 10% for a 140 dBSPL acoustic input to the MEMS microphone.

10. A method of operating an integrated circuit comprising a signal amplifier comprising an input node configured to be coupled to a capacitive signal source, a controllable attenuation circuit coupled to the input node of the signal amplifier, a single-ended to differential conversion circuit coupled to an output of the signal amplifier, a peak detector coupled to an output of the single-ended to differential conversion circuit, a differential comparator coupled to an output of the peak detector, and a control circuit coupled between the an output of the differential comparator and a control input of the controllable attenuation circuit, the method comprising:
amplifying a signal provided by the capacitive signal source to form a singled-ended amplified signal using the signal amplifier;
converting the single-ended amplified signal to a differential amplified signal using the single-ended to differential conversion circuit;
detecting a peak voltage of the differential amplified signal using the peak detector, wherein the peak detector comprises a positive peak detector and a negative peak detector;
comparing the detected peak voltage to a threshold using the differential comparator by comparing an output of the positive peak detector with a positive threshold, and comparing an output of the negative peak detector with a negative threshold; and
adjusting the controllable attenuation circuit in response to detecting the peak voltage using the control circuit, wherein an attenuation of the controllable attenuation circuit is adjusted to a value proportional to the detected peak voltage.

11. The method of claim 10, wherein the control circuit comprises a counter coupled to the output of the differential comparator, and the method further comprises incrementing the counter when the output of the peak detector exceeds the threshold, and decrementing the counter when the output of the peak detector does not exceed the threshold.

12. The method of claim 11, wherein the control circuit further comprises a look-up table circuit coupled to the output of the counter, and the method further comprises applying an output of the look-up table circuit to the control input of the controllable attenuation circuit.

13. The method of claim 10, wherein the integrated circuit further comprises a zero crossing detector coupled to the output of the signal amplifier, and the method further comprises adjusting, using the control circuit, the controllable attenuation circuit when the zero crossing detector detects a zero crossing.

14. The method of claim 10, wherein:
the controllable attenuation circuit comprises a plurality of capacitors, and a plurality of switches coupled between the plurality of capacitors and the input node of the signal amplifier; and
the method further comprises controlling the plurality of switches by the control circuit.

15. The method of claim 10, wherein:
the controllable attenuation circuit comprises a controllable resistor; and
the method further comprises controlling a resistance of the controllable resistor.

16. The method of claim 10, further comprising:
increasing the attenuation of the controllable attenuation circuit at a first rate if the peak voltage exceeds the threshold, and
decreasing the attenuation at a second rate if detected peak voltage does not exceed the threshold, wherein the first rate is greater than the second rate.

* * * * *